(12) United States Patent
Furumiya

(10) Patent No.: US 6,465,819 B2
(45) Date of Patent: *Oct. 15, 2002

(54) SOLID STATE IMAGING APPARATUS WITH TRANSISTORS HAVING DIFFERENT GATE INSULATING FILM THICKNESS AND MANUFACTURING METHOD FOR THE SAME

(75) Inventor: Masayuki Furumiya, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/369,022

(22) Filed: Aug. 6, 1999

(65) Prior Publication Data

US 2002/0088975 A1 Jul. 11, 2002

(30) Foreign Application Priority Data

Aug. 25, 1998 (JP) .......................................... 10-238631

(51) Int. Cl.$^7$ ............................................. H01L 29/72
(52) U.S. Cl. ........................ 257/215; 257/222; 257/229; 257/236; 257/392; 257/402
(58) Field of Search .................................. 257/215, 222, 257/229, 236

(56) References Cited

FOREIGN PATENT DOCUMENTS

| JP | 1-185970 | | 7/1989 | |
|---|---|---|---|---|
| JP | 3-192766 | * | 8/1991 | |
| JP | 04-206742 | * | 7/1992 | ................. 257/215 |
| JP | 4-207043 | | 7/1992 | |
| JP | 4-369187 | * | 12/1992 | |
| JP | 5-3216 | | 1/1993 | |
| JP | 5-63177 | * | 3/1993 | |
| JP | 5-206438 | * | 8/1993 | ................. 257/215 |

* cited by examiner

*Primary Examiner*—Edward Wojciechowicz
(74) *Attorney, Agent, or Firm*—Sughrue Mion, PLLC

(57) ABSTRACT

A solid state imaging apparatus includes a detection capacitor storing a signal charge, and an output amplifier including a plurality of transistors, and outputting the signal charge stored in the detection capacitor as a voltage signal. A gate electrode of one of the plurality of transistors as an input transistor is connected to the detection capacitor. Also, the plurality of transistors other than the input transistor has a thinner gate insulating film than the input transistor.

9 Claims, 13 Drawing Sheets

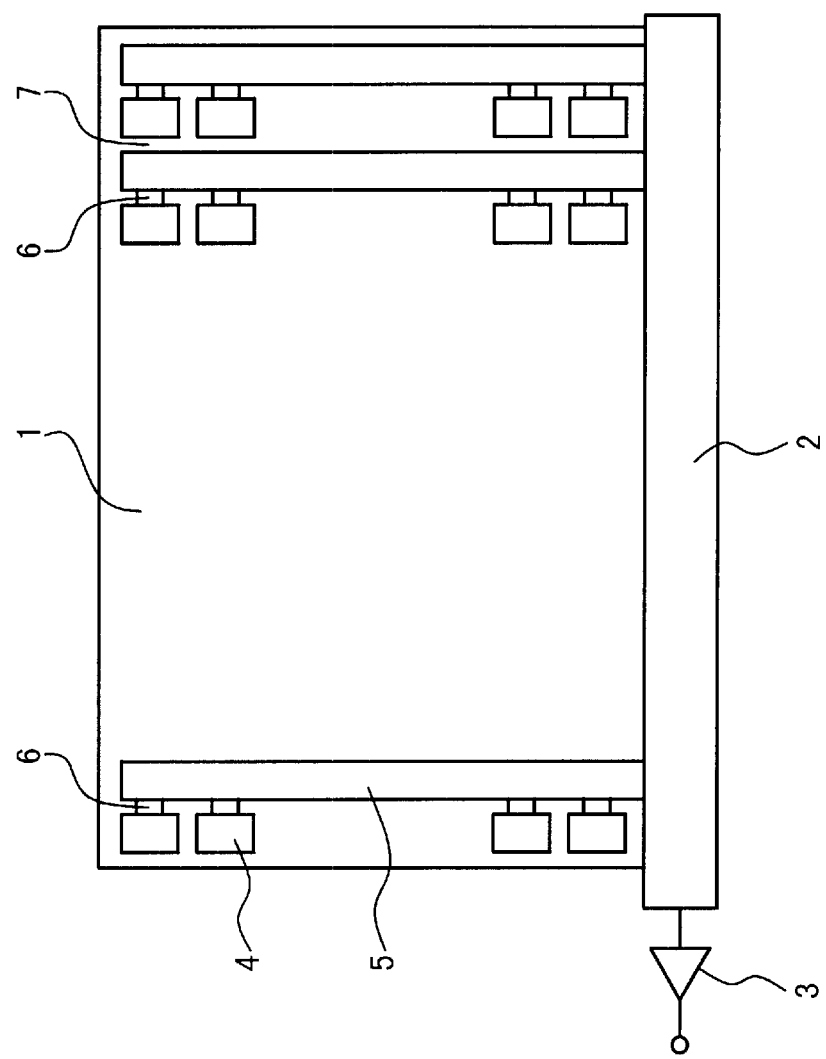

Fig. 9A-1      Fig. 9A-2
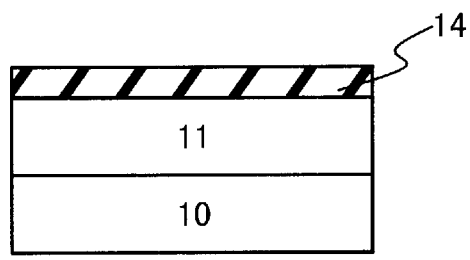 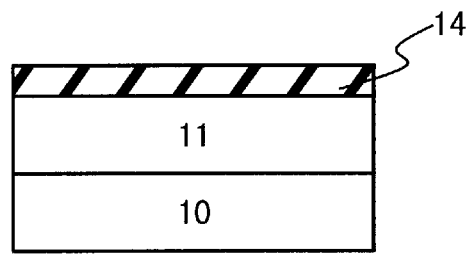
Fig. 9B-1      Fig. 9B-2
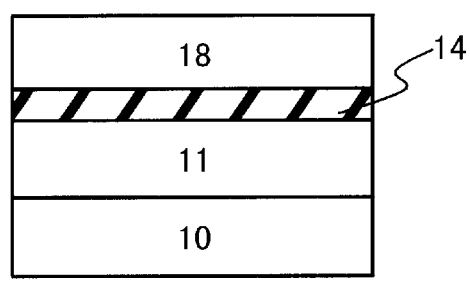 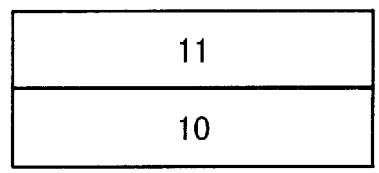

Fig. 9C-1     Fig. 9C-2
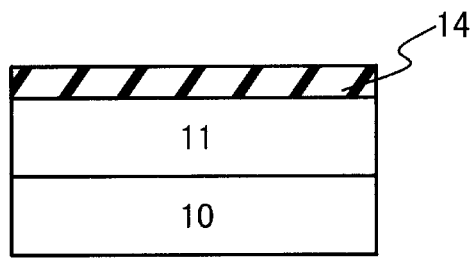 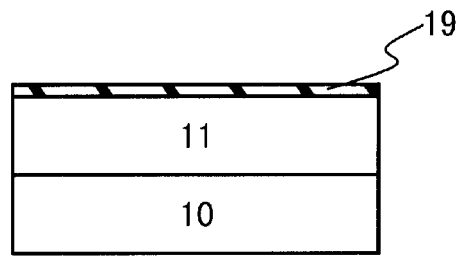
Fig. 9D-1     Fig. 9D-2
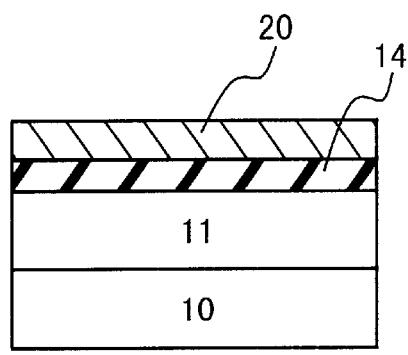 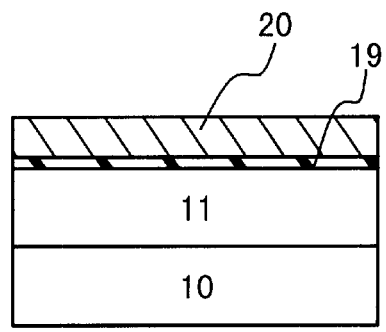

Fig. 9E-1  Fig. 9E-2
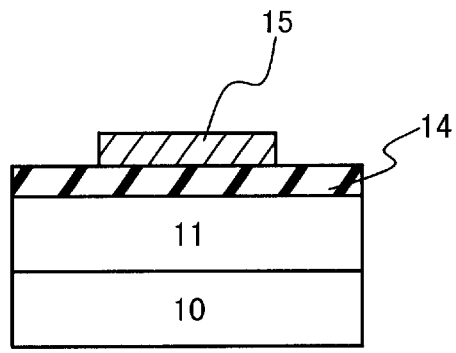 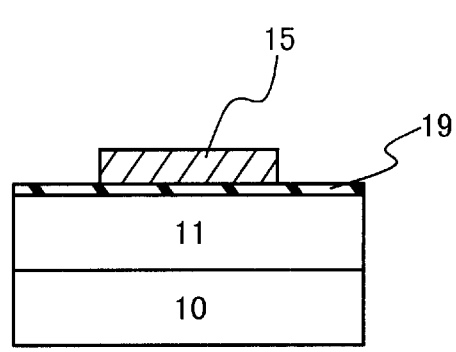
Fig. 9F-1  Fig. 9F-2
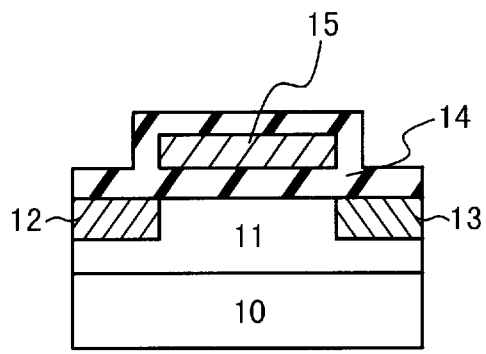 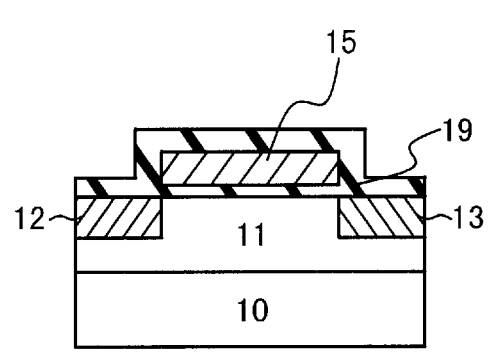

SOLID STATE IMAGING APPARATUS WITH TRANSISTORS HAVING DIFFERENT GATE INSULATING FILM THICKNESS AND MANUFACTURING METHOD FOR THE SAME

BACKGROUND OF THE INVENTION

1. Field of the Invention

The present invention relates to a solid state imaging apparatus and a manufacturing method for the same. More particularly, the present invention relates to a solid state imaging apparatus with transistors having different film thickness of gate insulating films and a manufacturing method for the same.

2. Description of the Related Art

A solid state imaging apparatus using a charge coupled device (CCD) is known as a typical example of the solid state imaging apparatus. FIG. 1 shows the well known CCD solid state imaging apparatus of an interline transfer system.

Referring to FIG. 1, the imaging apparatus is composed of an imaging section 101, a horizontal CCD section 102 extending in a horizontal direction and an output section 103 as a charge detecting section. The imaging section 101 is composed of a plurality of photodiodes (photoelectric converting elements) 104 arranged in a 2-dimensional matrix manner to convert a light signal into a signal charge through photoelectric conversion and to store the signal charge.

Further, a vertical CCD section 105 is adjacent to a column of the photodiodes 104 to transfer the signal charge in a vertical direction. A read section 106 is provided between the photodiode 104 and the vertical CCD section 105 to read the signal charge. A remaining section of the imaging section 101 other than the above-described portions is an element separating region 107.

Such an imaging apparatus operates as follows. That is, a signal charge is stored through photoelectric conversion by the photodiode 104 for a predetermined time and is read out by the vertical CCD section 105 through the read section 106. After being read out to the vertical CCD section 105, the signal charge is transferred to the vertical direction for the horizontal CCD section 102 one line by one line. After being transferred to the horizontal CCD section 102, the signal charge is transferred to the horizontal direction in the horizontal CCD section 102, and is detected as an output voltage by the output section (charge detecting section) 103.

The output section 103 is composed of a detection capacitor as a floating diffusion layer capacitor and an output amplifier which is connected with the detection capacitor. From the viewpoint of impedance conversion, a source follower grounding circuit type amplifier of 2 stages or 3 stages and composed of MOS transistors is used as the output amplifier in many cases. The source follower grounding circuit type amplifier is referred to as a source follower type amplifier, hereinafter.

FIG. 2 schematically shows the floating diffusion layer capacitor as a detection capacitor 108 and a 3-stage source follower amplifier 109 connected with the detection capacitor. A signal charge is transferred in the horizontal CCD section 102 (not shown in FIG. 2), and is stored into the floating diffusion layer capacitor 108. The potential change at this time is transmitted to the transistors in the subsequent stage through a driver transistor D101 in FIG. 1 in the initial stage of the amplifier. Then, the potential change is outputted from an output terminal Vout.

In this case, the driver transistors are the transistors D101, D102 and D103 in the source follower type amplifier. In the driver transistor, the source side is connected with a higher potential power supply Vdd. The transistors L101, L102 and L103 in which the drains are grounded are called load transistors. Moreover, sets of transistors D101 and L101, D102 an L102, and D103 and L103 are called the first stage of the amplifier, the second stage, and the third stage, respectively, from the input side to which the floating diffusion layer capacitor 108 is connected. In each set, the drain of the driver transistor and the source of the load transistor are connected with each other.

FIGS. 3A and 3B show cross sectional structure of the transistor of the output amplifier. FIGS. 3A and 3B show the cross sectional structures of the transistors of the first stage of the amplifier and the second or third stage of the amplifier, respectively. A P-type well 111 is formed on an N-type substrate 110, and the transistor has a source region 112 and drain region 113 which are formed in P-type well 111 as high concentration N-type impurity regions. A gate electrode 115 is formed on the channel between the source region 112 and the drain region 113 through a gate insulating film 114 having the film thickness from about 70 nm to about 85 nm. Thus, the transistor is formed.

The channel lengths of the transistors are illustrated in FIGS. 3A and 3B to equal to each other. However, the channel length is different depending on whether the transistor is the driver transistor or the load transistor. Moreover, the channel length is different depending on whether the transistor is in the first stage, the second stage or the third stage. In FIGS. 3A and 3B, it should be noted that these transistors of the amplifier have different channel lengths and different channel widths sometimes but have the same structure in the vertical direction.

FIG. 4 shows a cross sectional view of the first stage transistor of the amplifier and the horizontal CCD section 102 in a charge transfer direction from the floating diffusion layer to a reset. The horizontal CCD section 102 is formed on an N-type embedded channel 116 as the charge transfer channel which is formed in the P-type well 111 on the N-type substrate 110. Also, the horizontal CCD section 102 has the charge transfer electrode formed of a polysilicon film through the gate insulating film 114. The gate insulating film 114 is sometimes composed of a multiple film (ONO film) in which an oxide film ($SiO_2$) is formed in the either side of a nitride film ($Si_3N_4$). Also, the charge transfer electrode is sometimes formed of 2 polysilicon films.

The detection capacitor 108 as the floating diffusion layer capacitor is formed at an end portion of the horizontal CCD section 102 through the output gate OG. A high concentration N-type impurity layer is formed such that the signal charge stored in detection capacitor 108 can be taken out through a contact. A positive potential is given to a reset electrode φR after the charge detection, so that the signal charge is discharged to the reset drain 117. Also, the potential of the floating diffusion layer is reset.

On the other hand, a drive transistor of an amplifier in the output section is formed as a MOS (Metal Oxide Semiconductor) type transistor. Each transistor has a drain region 113 and a source region 112 of high concentration N-type impurity regions formed in opposing positions of a P-type well 111 on an N-type substrate 110. A gate electrode 115 of a polysilicon film is formed through a gate insulating film 114. It should be noted that although not illustrated in FIG. 4, the vertical CCD section 105 has substantially the same structure as that of the horizontal CCD section 102.

FIGS. 5A-1 and 5A-2 to 5D-1 and 5D-2 show the processes in the manufacturing method of the conventional solid state imaging apparatus. The figures with "-1" show the processes of the manufacturing method of the amplifier transistor of the first stage, and the figures with "-2" show the processes of the manufacturing method of the amplifier transistor of the second or third stage. The processes of the figures with "-1" are completely the same processes of the figures with "-2". As mentioned above, in the conventional solid state imaging apparatus, all of these amplifier transistors have the same structure.

As shown in FIGS. 5A-1 and 5A-2, the P-type well 111 is first formed on the N-type substrate 110 and then the gate insulating film 114 is formed. An N-type embedded channel is already formed in a region where the vertical CCD and the horizontal CCD should be formed, although not illustrated. When an ONO film is used for the gate insulating film, the multiple film which is composed of an oxide film, a nitride film and an oxide film is formed in order.

Next, as shown in FIGS. 5B-1 and 5B-2, the electrode film 120 is formed of a polysilicon film through a gate insulating film 114.

Next, as shown in FIGS. 5C-1 and 5C-2, a patterning method and an etching method for a photolithography method are applied to form the gate electrode 115.

Next, as shown in FIGS. 5D-1 and 5D-2, an ion implanting method of high concentration N-type impurities is performed in self-alignment with the gate electrode 115 to forming the source region 112 and the drain region 113. Thus, the MOS type transistors are completed.

Through the above processes, the conventional solid state imaging apparatus is manufactured.

Next, the floating diffusion layer capacitor and the structure of the amplifier transistor will be described in detail. How the detection sensitivity when a signal charge is converted into a signal voltage is determined will be described from the relation between the floating diffusion layer capacitor 108 as the detection capacitor in the output section and a gain of the output amplifier. The detection sensitivity is the conversion efficiency that the signal charge is converted into the voltage. Thus, as the efficiency becomes higher, the larger output voltage can be obtained. Therefore, there is a problem in how the detection sensitivity (charge-voltage conversion efficiency) is increased.

When it is supposed that the detection capacitor is Cfj (fF) and the gain of the output amplifier is g, the detection sensitivity Sen ($\mu$V/e) is expressed by the following equation (1).

$$Sen = q \times g / Cfj \qquad (1)$$

where q is a charge of an electron. It could be understood from the equation (1) that the detection sensitivity can be improved when the detection capacitor Cfj becomes smaller, or when the gain g becomes larger.

Such a detection capacitor Cfj will be considered. The detection capacitor Cfj is composed of the base PN junction capacitor C1 of the floating diffusion layer shown in FIG. 4. Recently, however, the base capacitor has been reduced and the influence of the base capacitor to the whole is decreased rather than previously. The influence of capacitors such as wiring capacitor C2 and other parasitic capacitors C3 and C4 becomes large. A relatively large one of such capacitors is the gate capacitor C3 of the amplifier transistor of the first stage. For this reason, to decrease the detection capacitor Cfj, it is necessary to decrease the gate capacitor of the amplifier transistor of the first stage, in addition to the other capacitors. In order to decrease the gate capacitor C3, it is sufficient that the gate width W of the amplifier transistor is made small such that the capacitor width can be made small.

However, there is a limit in the decrease of the gate width W of the amplifier transistor. In order to maintain the characteristic of the amplifier transistor, the width of the amplifier transistor is decreased while the ratio (W/L) of the gate width W to the gate length L is maintained. In this case, however, when the gate length L becomes smaller than about 3 $\mu$m, the short channel effect occurs. Thus, the expected transistor characteristic cannot be obtained. Therefore, it is difficult to further decrease the width or length.

On the other hand, with the amplifier gain, the optimization of the sizes of the transistors of the amplifier has been already performed. Therefore, a further higher gain cannot be simply attained. This is because the gate insulating film used for the amplifier transistor is the same as the gate insulating film used for the vertical and horizontal CCD transfer channels in which the transfer efficiency is important.

With the gate insulating film on the CCD transfer channel, the transfer efficiency is generally degraded when the film thickness of the gate insulating film is made thin. Therefore, the gate insulating film is necessary to have the film thickness of some degree. This film thickness is approximately in a range of 70 nm to about 85 nm. Therefore, if the film thickness of the gate insulating film is made thin, the transconductance gm of the amplifier transistor and the amplifier gain can be improved. Conventionally, the gate insulating film of the transfer electrode had priority for the higher transfer efficiency.

In conjunction with the above description, a solid state imaging apparatus is described in Japanese Laid Open Patent application (JP-A-Heisei 3-192766). In this reference, the imaging apparatus is composed of photoelectric conversion means provided on the surface of a semiconductor substrate. Signal charge transfer means transfers a signal charge produced by the photoelectric conversion means. An output amplifier detects the signal charge transferred by the signal charge transfer means as a voltage change of a signal detection capacitor which is provided on the surface of the semiconductor substrate and outputs a signal voltage corresponding to the detected voltage change. A conductive film is provided between the signal detection capacitor and the surface of the semiconductor substrate and is supplied at the end with an output signal of the output amplifier.

Also, a CCD solid state imaging apparatus is described in Japanese Laid Open Patent application (JP-A-Heisei 4-369187). In this reference, a signal charge from the final stage of the charge transfer section 2 composed of a CCD is once stored in a floating diffusion FD via an output gate OG. A voltage change $\Delta V$ due to the stored charge is supplied to a source follower circuit 5, so that an image signal S is taken out from the output terminal $\phi$out of the source follower circuit in an output section 1. An output side of the source follower circuit 5 is connected with the output gate OG so that the image signal S outputted from the source follower circuit 5 is fed back to the output gate OG.

Also, a CCD solid state imaging apparatus is described in Japanese Laid Open Patent application (JP-A-Heisei 5-63177). In this reference, a signal charge from the final stage of the charge transfer section is stored in a floating diffusion region FD. A voltage change due to the stored charge is supplied to a source follower circuit 5 which is composed of a drive MOS transistor 3 and a load MOS transistor 4. As a result, the signal charge is taken out as an output voltage Vout from the output terminal Tout of the source follower circuit 5. The drive MOS transistor and the load MOS transistor in the source follower circuit 5 are formed in well regions 21 and 22 on a semiconductor substrate, respectively. The impurity density of the well region 21 is different from that of the well region 22.

SUMMARY OF THE INVENTION

Therefore, an object of the present invention is to provide a solid state imaging apparatus and a method of manufacturing of the same.

Another object of the present invention is to provide a solid state imaging apparatus having detection sensitivity improved and a method of manufacturing of the same.

Still another object of the present invention is to provide a solid state imaging apparatus having amplifier gain improved and a method of manufacturing of the same.

Yet still another object of the present invention is to provide a solid state imaging apparatus with transistors having different gate insulating film thicknesses and a method of manufacturing of the same.

In order to achieve an aspect of the present invention, a solid state imaging apparatus includes a detection capacitor storing a signal charge, and an output amplifier including a plurality of transistors, and outputting the signal charge stored in the detection capacitor as a voltage signal. A gate of one of the plurality of transistors as an input transistor is connected to the detection capacitor. Also, the plurality of transistors other than the input transistor has a thinner gate insulating film than the input transistor.

The output amplifier preferably is a source follower amplifier circuit.

Also, the output amplifier includes a plurality of stages, each of which includes two of the plurality of transistors as a drive transistor and as a load transistor, and the input transistor is the drive transistor of a first stage of the plurality of stages. In this case, the drive transistors of the plurality of stages other than the first stage may have the gate insulating film thinner than that of the input transistor. Instead, the drive transistors and the load transistors in the plurality of stages other than the first stage may have the gate insulating film thinner than that of the input transistor.

In addition, the solid state imaging apparatus may further include a CCD transfer section having an insulting film and transferring the signal charge to the detection capacity. In this case, a film thickness of the insulating film of the CCD transfer section is substantially the same as that of the gate insulating film of the input transistor. In this case, the insulating film of the CCD transfer section and the gate insulating film of the input transistor may be formed of an ONO film. Instead, the insulating film of the CCD transfer section and the gate insulating film of the input transistor may be formed of an oxide film.

In order to achieve another aspect of the present invention, a method of manufacturing a solid state imaging apparatus include:

partially forming a first gate insulating film and a second gate insulating film in a region for an output amplifier on a semiconductor region of a first conductive type, a film thickness of the first gate insulating film being thicker than that of the second gate insulating film forming gate electrodes on the first gate insulating film and the second gate insulating film in the region; and performing ion implantation of impurity ions to complete a plurality of transistors, one of the plurality of transistors as an input transistor having the first gate insulating film and connected to a detection capacitor.

The partially forming a first gate insulating film and a second gate insulating film preferably includes:

forming the first gate insulating film in the region on the semiconductor region;

removing the first gate insulating film from a first region, wherein the region includes the first region and a second region, the input transistor is formed in the second region; and forming the second gate insulating film in the first region, a film thickness of the second gate insulating film being thinner than the first insulating film. In this case, the forming the second gate insulating film includes thermally oxidizing the semiconductor region. Also, the first gate insulating film is made thicker through the thermal oxidizing.

In addition, the partially forming a first gate insulating film and a second gate insulating film may include:

forming the first gate insulating film as an insulating film of a CCD transfer section.

BRIEF DESCRIPTION OF THE DRAWINGS

FIGS. 5A-1 and 5A-2 to 5D-1 and 5D-2 are cross sectional views of the transistors in the output section of the conventional CCD solid state imaging apparatus;

FIG. 6 is a block diagram illustrating the structure of a solid state imaging apparatus according to a first embodiment of the present invention;

FIGS. 9A-1 and 9A-2 to 9F-1 and 9F-2 are cross sectional views of transistors of the output section of the solid state imaging apparatus according to the first embodiment of the present invention;

DESCRIPTION OF THE PREFERRED EMBODIMENTS

Figure 1:
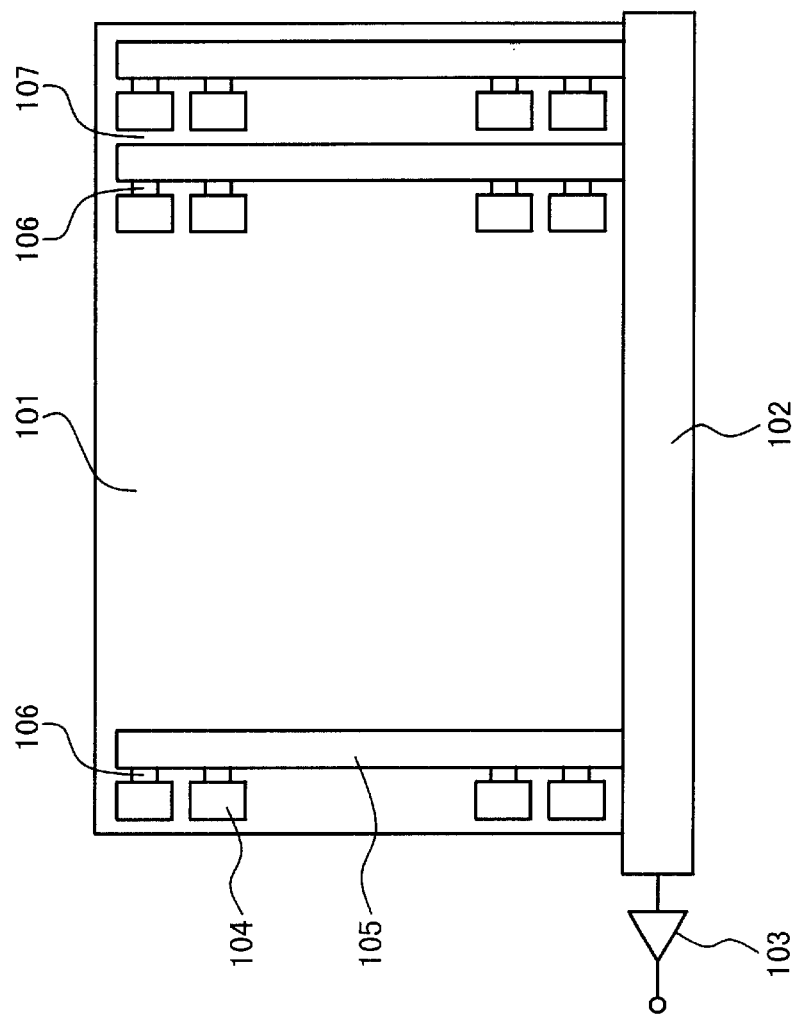
FIG. 1 is a block diagram illustrating the structure of a conventional CCD solid state imaging apparatus.

Hereinafter, the solid state imaging apparatus of the present invention will be described below in detail with reference to the attached drawings.

FIG. 6 is a schematic diagram illustrating the structure of the solid state imaging apparatus according to an embodiment of the present invention. Referring to FIG. 6, the imaging apparatus in the embodiment is composed of an imaging section 1, a horizontal CCD section 2 extending in a horizontal direction, and an output section 3 as a charge detecting section.

In the imaging region 1, a plurality of photodiodes 4 are arranged in a 2-dimensional matrix manner to convert a light signal into a signal charge and to store the signal charge.

A vertical CCD section 5 is provided in adjacent to a column of photodiodes 4 to transfer the signal charge to the vertical direction. A read section 6 is provided between the photodiode 4 and the vertical CCD section 5 to read the signal charge from the photodiode 4 to the vertical CCD 5. A region of the imaging section 1 other than a region where the above elements are formed is an element separating region 7.

Figure 7:
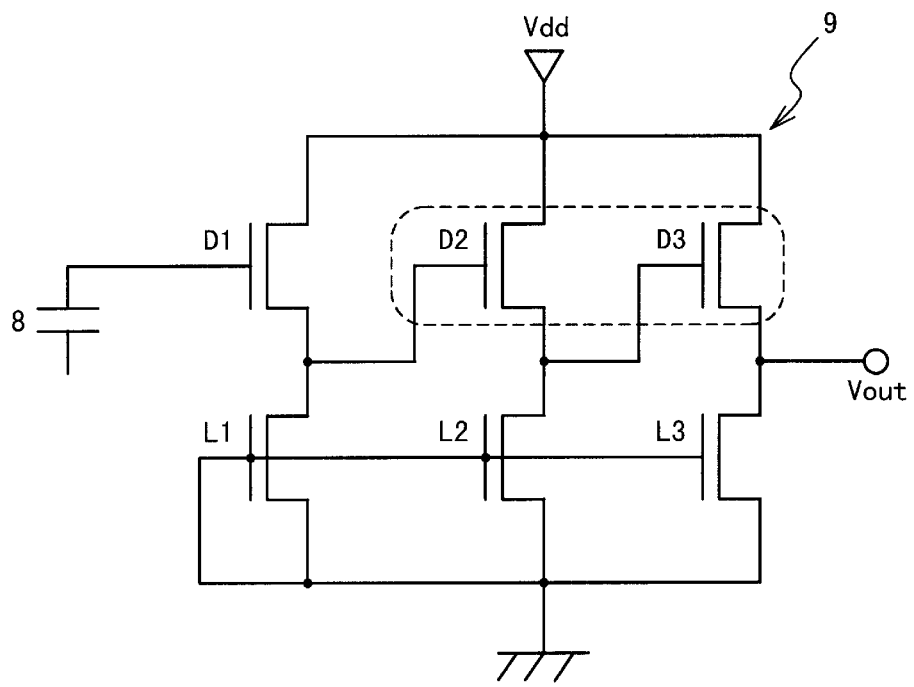
FIG. 7 is a circuit diagram illustrating the circuit structure of an output section of the solid state imaging apparatus according to a first embodiment of the present invention.

FIG. 7 is a circuit diagram illustrating the output section 3. Referring to FIG. 7, the output section 3 is composed of a floating diffusion layer capacitor 8 and an amplifier section 9. The amplifier section 9 is composed of two kinds of transistor groups. The two kinds of transistor groups are a driver transistor group and a load transistor group.

The driver transistor group is composed of a first stage driver transistor D1, a second stage driver transistor D2, and a third stage driver transistor D3. The load transistor group is composed of a first stage load transistor L1, a second stage load transistor L2, and a third stage load transistor L3. Such a connection structure of transistors is well known.

The signal charge is stored to the floating diffusion layer capacitor 8 and is connected with the first stage driver transistor D1. Then, the signal charge is connected with the second stage driver transistor D2 and the third stage driver transistor D3. Lastly, the signal charge is taken out as an output voltage Vout. It should be noted that the film thickness of a gate insulating film 19 of the second and third driver transistors D2 and D3 are thinner than that of the gate insulating film 14 of the first stage driver transistor D1, as shown in FIG. 7 by a dashed line.

Figure 8A:
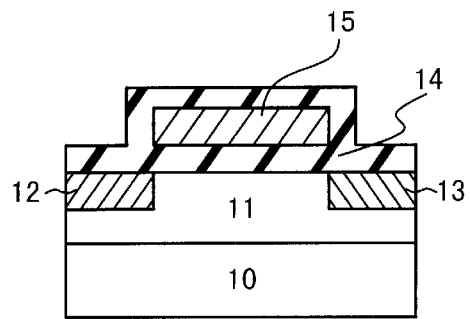
FIGS. 8A and 8B are cross sectional views of transistors of the output section of the solid state imaging apparatus according to the first embodiment of the present invention.
Figure 8B:
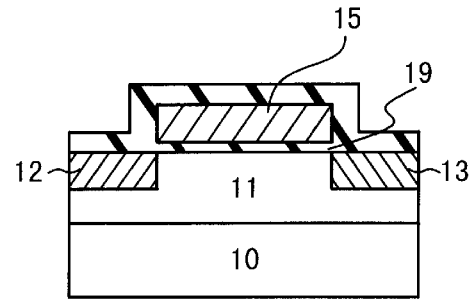

FIG. 8A shows a cross sectional view of the first stage driver transistor D1, and FIG. 8B shows a cross sectional view of the second or third stage driver transistor D2 or D3. The film thickness of the gate insulating film of the first stage driver transistor D1 is formed in a range of about 70 nm to 85 nm. On the other hand, the film thicknesses of the second stage driver transistor D2, third stage driver transistor D3, second stage load transistor L2, and third stage load transistor L3 are to have the film thickness in a range of about 20 nm to 60 nm. Because the film thicknesses of the gate insulating films of the transistors of the second and third stages are made thin in this way, the transconductances gm of the transistors can be improved, compared with the case where the gate insulating film thicknesses of all the transistors are thick. As a result, about 10% or 25% is attained as the improvement percentage of such a transconductance gm.

On the other hand, the film thickness of the gate insulating film of the driver transistor of the first stage of the amplifier is the thickness is equal to that of the conventional driver transistor. As a result, there is no increase of the detection capacity. Therefore, the improvement percentage of the transconductance gm which has been accomplished by making the film thickness of the gate insulating film of the transistor of the second stage thin contributes to the improvement percentage of the amplification gain, just as it is. Consequently, it leads the improvement percentage of the detection sensitivity of the output section 3. The improvement percentage of the detection sensitivity is about 10% or about 25%. This improvement percentage is large considerably in the art.

Next, FIGS. 9A-1 and 9A-2 to 9F-1 and 9F-2 are diagrams showing the manufacturing method of the amplifier transistor of the solid state imaging apparatus. The figures with "-1" are diagram showing the manufacturing method of the driver transistor D1 of the first stage of the amplifier section 9. The figures with "-2" diagrams showing the manufacturing method of the driver transistor D2 or D3 of the second or the third stage of the amplifier section 9.

Figure 2:
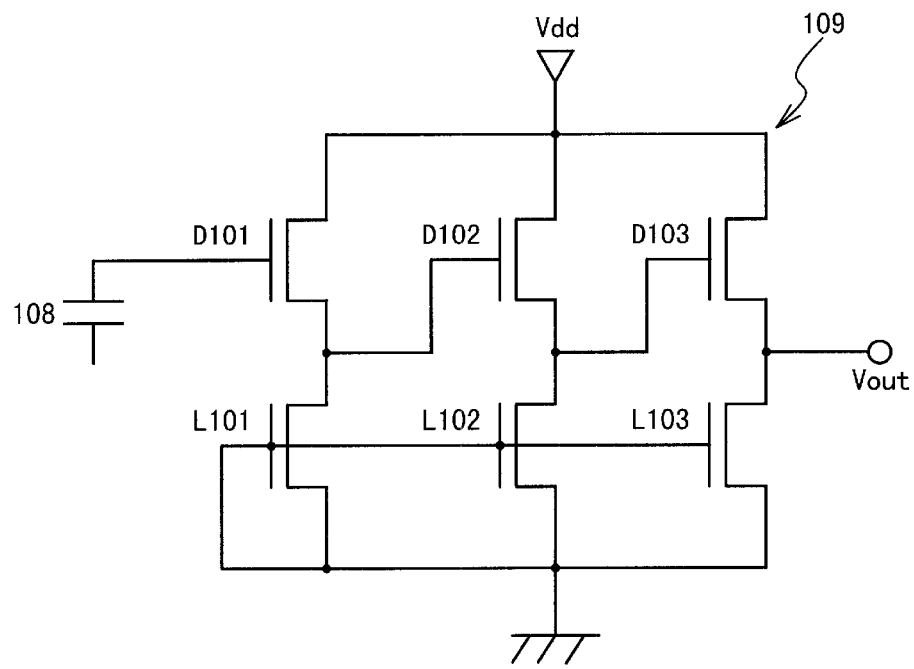
FIG. 2 is a circuit diagram illustrating the circuit structure of an output section of the conventional CCD solid state imaging apparatus.
Figure 3A:
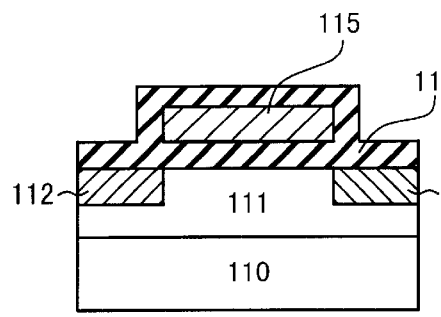
FIGS. 3A and 3B are cross sectional views of transistors in the output section of the conventional CCD solid state imaging apparatus.
Figure 3B:
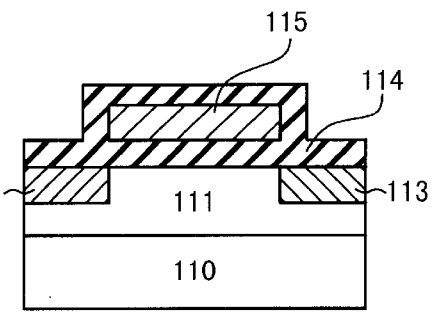
Figure 4:
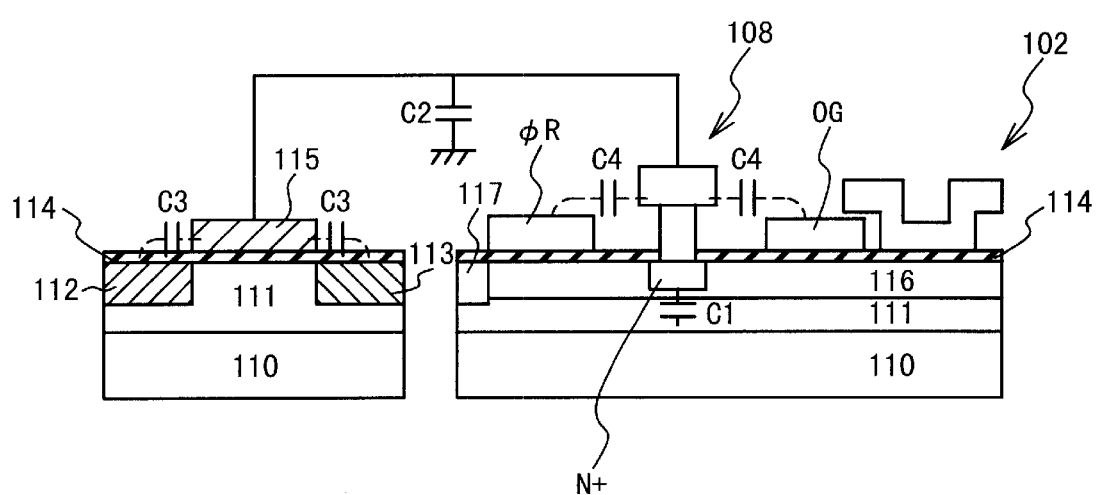
FIG. 4 is a cross sectional view of a charge transfer structure of the conventional CCD solid state imaging apparatus.
Figures 1, 5A:
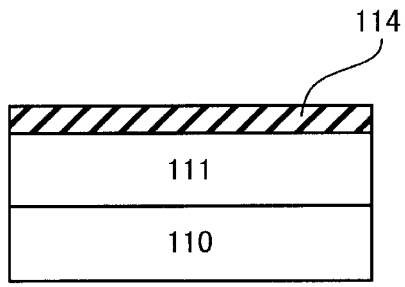
Figures 2, 5A:
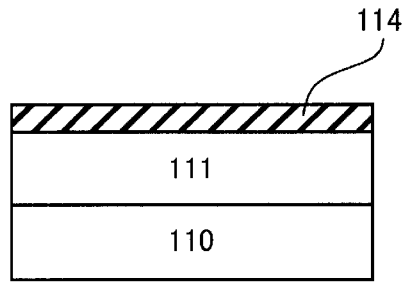
Figures 1, 5B:
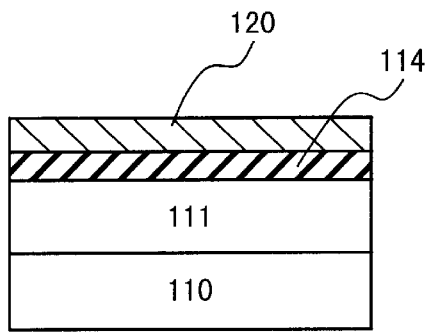
Figures 2, 5B:
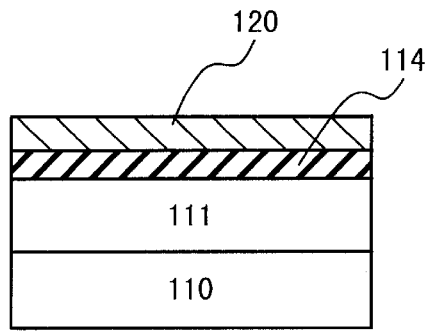
Figures 1, 5C:
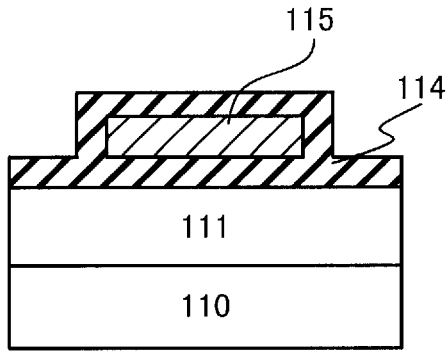
Figures 2, 5C:
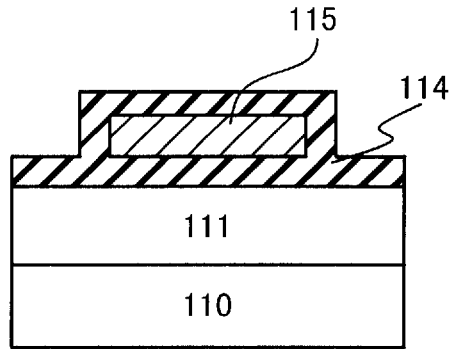
Figures 1, 5D:
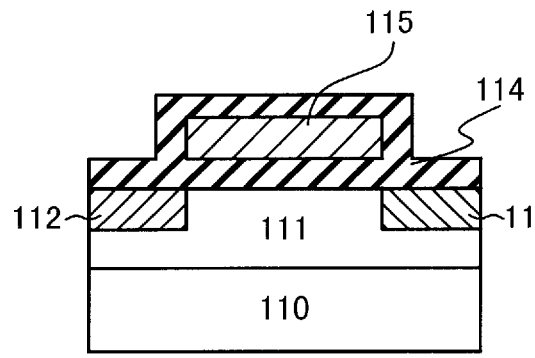
Figures 2, 5D:
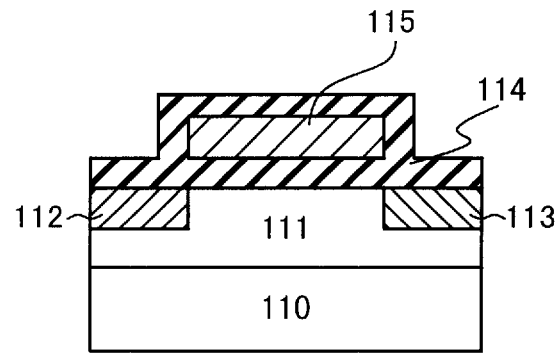

As shown in FIGS. 9A-1 and 9A-2, a P-type well 11 is formed on the surface of an N-type substrate 10. A gate insulating film 14 is formed on the surface of the P-type well 11. An N-type embedded channel has been already formed in a region in which the vertical CCD section (not illustrated) and the horizontal CCD (not illustrated) should be formed. When an ONO film is used for the gate insulating film 14, a multiple film composed of an oxide film, a nitride film and an oxide film in order is formed.

Next, as shown in FIGS. 9B-1 and 9B-2, a photoresist layer 18 is formed on the gate insulating film 14 in the region where the driver transistor D1 of the first stage is to be formed and the region where the vertical CCD section and the horizontal CCD section are to be formed. The gate insulating film is removed by the etching method from the regions of the transistors D2 and D3 in the second and third stages. The load transistors L1, L2 and L3 will be described in the next the second embodiment in details.

Next, as shown in FIGS. 9C-1 and 9C-2, after the photoresist 18 is removed, a thin gate insulating film 19 is formed by a thermal oxidizing method in the region where the driver transistors D2 and D3 of the second and third stages of the amplifier section are formed. At this time, the gate insulating film 14 in the region where the drive transistor of the first stage of the amplifier section is formed and in the region where the vertical CCD section and the horizontal CCD section are formed are thermally oxidized at the same time. Therefore, the film thickness after the process shown in FIGS. 9C-1 and 9C-2 becomes rather thicker than the gate insulating film 14 after the process shown in FIGS. 9B-1 and 9B-2 in the film thickness. In order to increase the film thickness of the gate insulating film 14 in the region where the driver transistor of the first stage of the amplifier section is formed and the region where the vertical CCD section and the horizontal CCD section are formed to have a desired film thickness, the film thickness of the thermal oxidizing film is controlled.

Next, as shown in FIGS. 9D-1 and 9D-2, a polysilicon film 20 is formed.

Next, as shown in FIGS. 9E-1 and 9E-2, the polysilicon film 20 is subjected to a patterning process and etching process of a photolithography method to produce a gate electrode 15.

Subsequently, as shown in FIGS. 9F-1 and 9F-2, ion implanting of high concentration N-type impurity ions is performed in self-alignment with the gate electrode 15. Thus, a source region 12 and a drain region 13 are formed. Then, an insulating film is deposited. In this way, MOS type transistors are formed. Through the above processes, the solid state imaging apparatus of the present invention can be manufactured.

Figure 10:
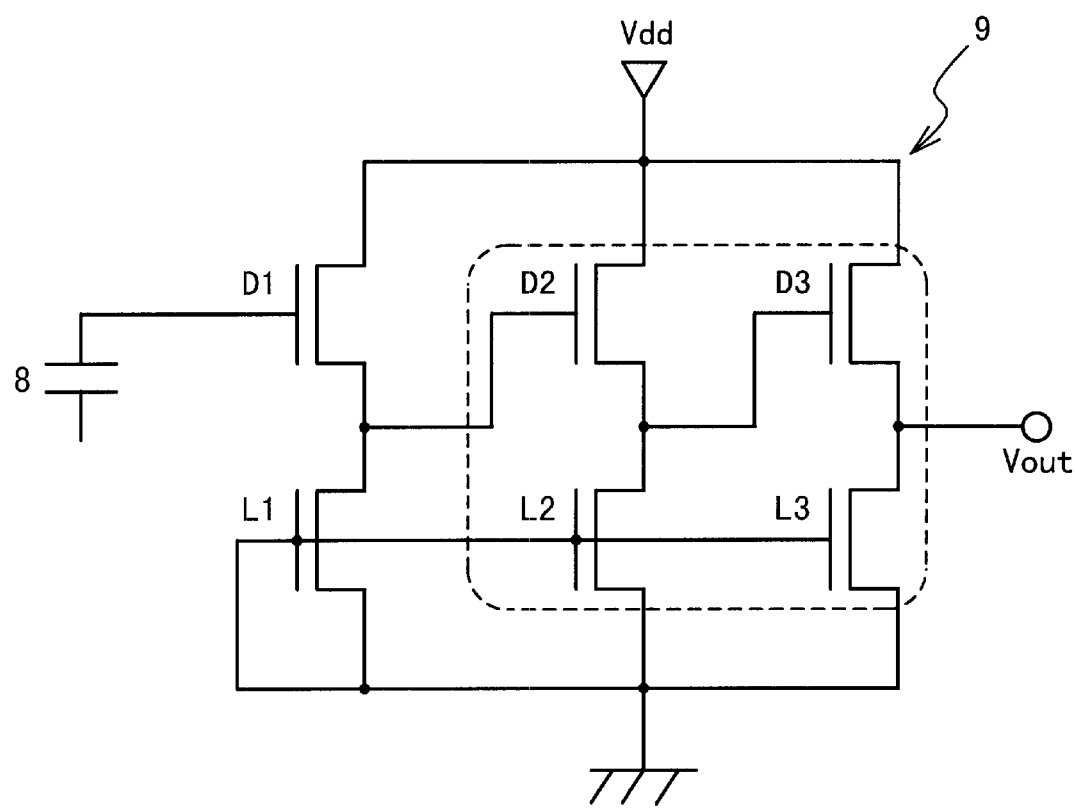
FIG. 10 is a circuit diagram illustrating the circuit structure of the output section of the solid state imaging apparatus according to a second embodiment of the present invention.

FIG. 10 is a structure schematic of the output section 3 of the solid state imaging apparatus according to the second embodiment of the present invention.

Referring to FIG. 10, a signal charge is stored in the floating diffusion layer capacitor 8 of the output section 3 and then is connected with the driver transistor D1 of the first stage of the amplifier section which is connected with the floating diffusion layer capacitor 8. Thus, the signal charge is connected with the driver transistors of the second and third stages and then is taken out as an output voltage Vout. It should be noted that the film thickness of the gate insulating films of the driver transistor D2 of the second stage, driver transistor D3 of the third stage, and the load transistors L2 and L3 are thinner than the film thickness of the gate insulating film of the driver transistor of the first stage, as shown in FIG. 10 by a dashed line.

The solid state imaging apparatus in the second embodiment is different from the first embodiment in the following point. That is, in the first embodiment, only the driver transistors are is made thin in the film thickness of the gate insulating film. However, in the second embodiment, the gate insulating films of the load transistors are made thin in addition to the gate insulating films of the driver transistors. The amplifier gain attained in the second embodiment is the same as in the first embodiment. However, the imaging apparatus in the second embodiment can be manufactured simpler than that in the first embodiment.

For example, it is supposed that the present invention is applied to the conventional 3-stage source follower amplifier. In this case, after the transistors are formed to have the gate insulating films with the same film thickness as the driver transistor of the first stage, the gate insulating films of desired transistors are necessary to be removed by an etching process. Therefore, a photolithography process is added. For this reason, the manufacturing cost increases so that the product cost increases finally.

There is a product in which the improvement of the detection sensitivity is necessary, even if the photolithography processes increases. Also, there is a product in which the product cost is important. In order to respond such a request, it is preferable that the photolithography process can be added as an option to the manufacture method. If the option is added, the solid state imaging apparatus can be provided t o have the improved detection sensitivity. If the option is not added, the solid state imaging apparatus can be provided in a low cost.

In the first embodiment, when the driver transistors of the second and third stages are made thin in the gate insulating film, the gate width W and the gate length L of the load transistors of the first to third stages are optimized, of course. Therefore, the option cannot be added. From the design of the amplifier, the driver transistors of the second and third stages are necessary to be made thin.

Therefore, it is difficult to manufacture the imaging apparatus with the improved detection sensitivity or with no improvement based on whether or not the photolithography process is added in the same lower layer structure. If the imaging apparatus is manufactured just as it is, the operation point of the amplifier shifts, because the film thickness is not optimized. As a result, the linearity of the amplifier could not be held and the gain would be decreased.

On the other hand, in the second embodiment, the driver transistor and the load transistor of the amplifier are made thin in the gate insulating film at the same time. Therefore, the current flowing through the load transistor is controlled together with the driver transistor. Therefore, it is not necessary to change the gate width W and the gate length L of the load transistor depending upon whether or not the gate insulating film is made thin. This means that when the sizes of all the transistors are optimized in the design, the detection sensitivity can be improved when the gate insulating films are made thin. Also, the detection sensitivity is not improved but the photolithography process can be decreased, when the same film thickness as in the conventional one is adopted for the gate insulating film.

In this way, according to the second embodiment, the improvement result of the detection sensitivity is the same as in the first embodiment. However, when the present invention is applied, the detection sensitivity improvement can be made function as the option. Therefore, it is possible to manufacture the imaging apparatus with the detection sensitivity improvement or with no improvement depending upon whether or not the lithography process is applied. This leads the great effect in the manufacturing method.

Figure 11:
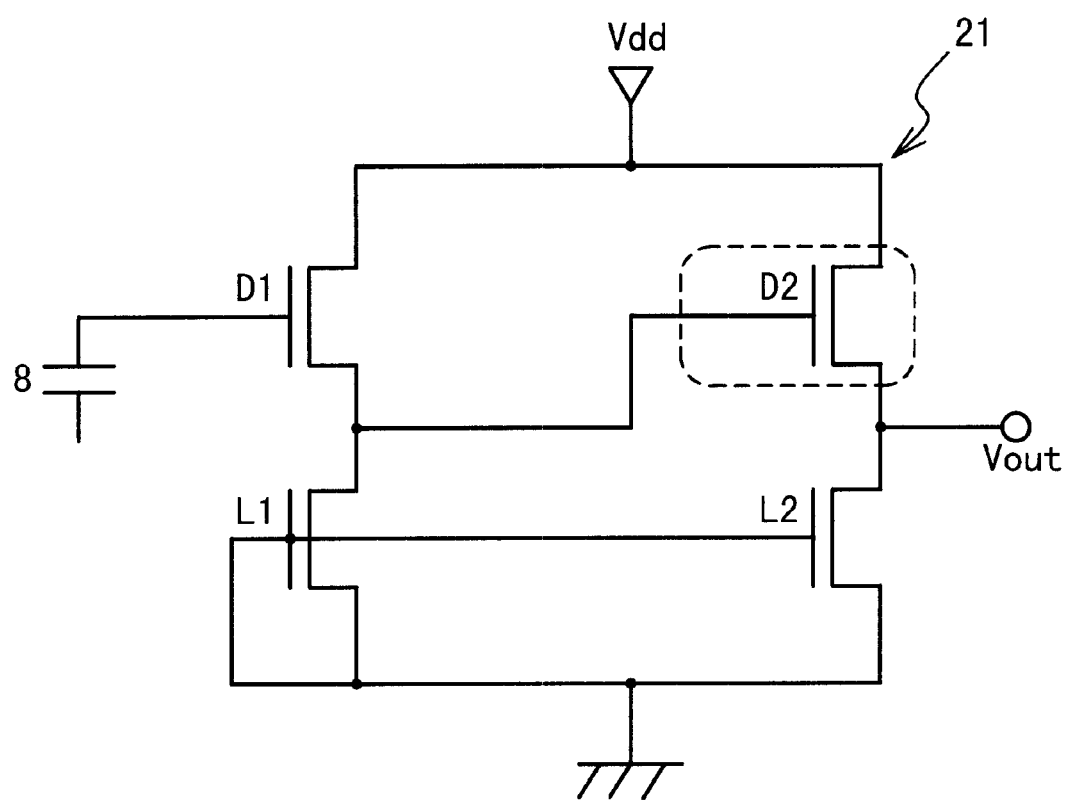
FIG. 11 is a circuit diagram illustrating the circuit structure of the output section of the solid state imaging apparatus according to a third embodiment of the present invention.

FIG. 11 is a structure schematic of the output section 3 of the solid state imaging apparatus according to the third embodiment of the present invention.

Referring to FIG. 11, the signal charge is stored in the floating diffusion layer capacitor 8 of the output section 3 and then is connected with the driver transistor D1 of the first stage of the amplifier section which is connected with the floating diffusion layer capacitor 8. After that, the signal charge is connected with the driver transistor D2 of the second stage and then is taken out as the output voltage. It should be noted that the film thickness of the gate insulating film of the driver transistor D2 of the second stage is made thinner than that of the driver transistor D1 of the first stage, as shown in FIG. 11 by a dashed line. The amplifier 21 in the third embodiment is the same as the first embodiment except that the source follower amplifier is composed of a 2-stage structure.

Figure 12:
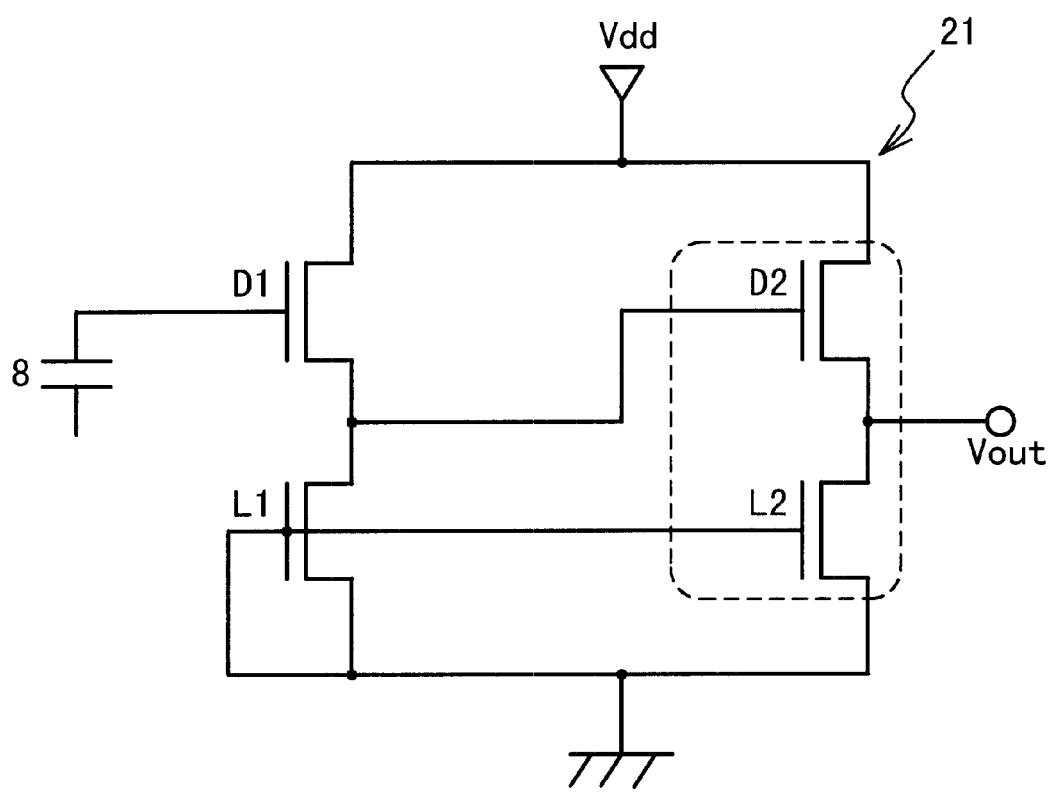
FIG. 12 is a circuit diagram illustrating the circuit structure of the output section of the solid state imaging apparatus according to a fourth embodiment of the present invention.

FIG. 12 is a structure schematic of the output section 3 of the solid state imaging apparatus according to the fourth embodiment of the present invention.

Referring to FIG. 12, the signal charge is stored in the floating diffusion layer capacitor 8 of the amplifier section 21 having the 2-stage structure. Then, the signal charge is connected with the driver transistor D1 of the first stage of the amplifier section which is connected with the floating diffusion layer capacitor 8. After that, the signal charge is connected with the driver transistor D2 of the second stage and then is taken out as the output voltage. It should be noted that the film thickness of the gate insulating films of the driver transistor D2 and the load transistor L2 of the second stage of the amplifier section are made thinner than that of the driver transistor D1 of the first stage of the amplifier section 21, as shown in FIG. 12 by a dashed line. The imaging apparatus in the fourth embodiment of the present invention is the same as that of the second embodiment except for the source follower amplifier structure of the 2-stage structure.

It should be noted that the transfer electrodes of the horizontal CCD section and the vertical CCD section are composed of a 2-layer polysilicon film structure in the above embodiments. However, the transfer electrode may be formed of a material other than polysilicon and the transfer electrode may have not the 2-layer structure but a 3-layer structure. Moreover, the transfer electrode may have a single layer. Also, in the above embodiment, the insulating film of the vertical CCD and the horizontal CCD and the driver transistor of the first stage of the amplifier are formed of the ONO film. However, the insulating film such as the gate insulating film may be formed of an oxide film.

Also, the source follower amplifier in the above embodiments is composed of the planer type transistors. However, the present invention is possible to apply to the embedded type transistors in the same way.

Moreover, in the above embodiments, the solid state imaging apparatus is supposed to be of a 2-dimensional CCD type. The present invention can be applied to a 1-dimensional CCD type solid state imaging apparatus. Also, the imaging apparatus is not limited to the CCD type solid state imaging apparatus. The present invention can be applied to an imaging apparatus having a circuit in which a signal charge is stored to the detection capacitor and is outputted as the output voltage by amplifier transistors.

As described above, according to the solid state imaging apparatus of the present invention, the gate insulating films of the amplifier transistors in the output section having the source follower amplifier of the 2 stages or multiple states structure are made thinner. Therefore, the transconductance gm of the transistor can be improved, so that the improvement of the amplifier gain can be attained.

If the gate insulating film of the driver transistor of the first stage of the amplifier would be made thin, the detection capacitor would increase so that the final detection sensitivity rather would become small. However, in the present invention, the gate insulating films of the driver transistors of the second and the third stages of the source follower amplifier having the 3-stage structure other than the driver transistor of the first stage are made thin. As a result, the detection sensitivity can be improved by 10% to 25%.

Further, the driver transistor and the load transistor at the same stage in the amplifier are formed to have the same film thickness of the gate insulating films. Therefore, there is not a change of the operation point of the amplifier. Consequently, the present invention can provide the solid state imaging apparatus with a desired with detection sensitivity by the photolithography process. Therefore, a variety of the products can be simply manufactured with the total manufacturing cost reduced.

What is claimed is:

1. A solid state imaging apparatus comprising:
   a detection capacitor storing a signal charge; and
   an output amplifier including a plurality of transistors, said output amplifier outputting said signal charge stored in said detection capacitor as a voltage signal and said plurality of transistors comprising an input transistor and a plurality of other transistors,
   wherein a gate electrode of said input transistor is connected to said detection capacitor, and
   wherein less than all of said plurality of other transistors have a thinner gate insulating film than a gate insulating film of said input transistor.

2. A solid state imaging apparatus according to claim 1, wherein said output amplifier is a source follower amplifier circuit.

3. A solid state imaging apparatus according to claim 1, wherein said output amplifier includes a plurality of stages, each of which includes two of said plurality of transistors as a drive transistor and as a load transistor, and said input transistor is the drive transistor of a first stage of said plurality of stages.

4. A solid state imaging apparatus according to claim 3, wherein said drive transistor of said plurality of stages other than said first stage has a gate insulating film thinner than that of said input transistor.

5. A solid state imaging apparatus according to claim 3, wherein said drive transistor and said load transistor of said plurality of stages other than said first stage has a gate insulating film thinner than that of said input transistor.

6. A solid state imaging apparatus comprising:
   a detection capacitor storing a signal charge;
   a CCD transfer section having an insulating film of a first thickness, said CCD transfer section transferring said signal charge to said detection capacitor; and
   an output amplifier including a plurality of transistors, said plurality of transistors comprising an input transistor and a plurality of other transistors, said output amplifier outputting said signal charge stored in said detection capacitor as a voltage signal,
   wherein said input transistor has a gate electrode connected to said detection capacitor, said input transistor having an insulating film of said first thickness,
   and wherein at least some of said plurality of other transistors have a gate insulating film of a second thickness, said first thickness being thicker than said second thickness.

7. A solid state imaging apparatus according to claim 6, wherein said insulating film of said CCD transfer section and said gate insulating film of said input transistor are formed of an ONO film.

8. A solid state imaging apparatus according to claim 6, wherein said insulating film of said CCD transfer section and said gate insulating film of said input transistor are formed of an oxide film.

9. A solid state imaging apparatus comprising:
   a CCD transfer section transferring a signal charge;
   a detection capacitor storing said signal charge; and
   an output amplifier including a plurality of transistors having respective gate insulating films different in film thickness from one another, said output amplifier inputting said signal charge from said detection capacitor and outputting said signal charge as a voltage signal.

* * * * *